United States Patent
Frankowsky et al.

(12) 
(10) Patent No.: US 6,603,694 B1
(45) Date of Patent: Aug. 5, 2003

(54) DYNAMIC MEMORY REFRESH CIRCUITRY

(75) Inventors: Gerd Frankowsky, Hoehenkirchen-Siegertsbrunn (DE); Gunther Lehmann, Poughkeepsie, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/068,789

(22) Filed: Feb. 5, 2002

(51) Int. Cl.$^7$ ................................................. G11C 7/00
(52) U.S. Cl. .................................. 365/222; 365/230.01
(58) Field of Search ............................. 365/222, 230.01

(56) References Cited

U.S. PATENT DOCUMENTS

| | | | |
|---|---|---|---|
| 5,331,601 A | 7/1994 | Parris | 365/230.08 |
| 5,875,143 A | 2/1999 | Ben-Zvi | 365/222 |
| 6,288,963 B1 * | 9/2001 | Kato | 365/222 |

OTHER PUBLICATIONS

Betty Prince, "Semiconductor Memories", 1983, Wiley, 2$^{nd}$ edition, pp. 308–313.*

* cited by examiner

*Primary Examiner*—M. Tran
(74) *Attorney, Agent, or Firm*—Daly, Crowley & Mofford, LLP (57) ABSTRACT

A circuit for refreshing data stored in an array of dynamic memory cells is provided. The circuit includes an integrated circuit chip. The chip has the array of memory cells formed thereon. The circuit also includes a refresh rate analysis circuit for determining data retention times in each one of the memory cells and from such determination refresh address modification signals. Also provided is a refresh address generator formed on the chip and fed by refresh command signals generated externally of the chip and by the address modification signals. The refresh address generator supplies an internal refresh commands along with refresh addresses to the array of memory cells. The cells have data stored therein refreshed in response to such internal refresh commands. The refresh rate analysis circuit determines cells in the array having data retention times less than a predetermined value.

6 Claims, 5 Drawing Sheets

FIG. 1A
(Prior Art)

RFC Refresh Command
RFA Refresh Address

DYNAMIC MEMORY REFRESH CIRCUITRY

TECHNICAL FIELD

This invention relates to dynamic memories and more particularly to refresh circuitry used in such memories.

BACKGROUND

As is known in the art, dynamic memories, such as Dynamic Random Access Memories (DRAMs) for example, require that the data stored therein be refreshed from time to time. In the case of a DRAM, an array of memory cells is provided on an integrated circuit chip. A typical memory cells includes a transistor coupled to a storage element, typically a capacitor. Each cell stores a bit (i.e., a logic 1 or a logic 0) of the data. The cells are arranged in a matrix of addressable rows and columns, with each row corresponding to a multi-bit word of data. The bit of data in each cell is stored on the capacitor as a charge, or lack thereof. This data must be refreshed because the charge of the capacitor leaks therefrom over time, i.e., over the charge, or data retention time of the cell. In order to prevent the loss of data, the data stored in the cell must be refreshed before the end of the data retention time. It follows then that the faster the charge leaks from the cell, the higher the data refresh rate required for the cell.

Generally, the power consumption used during a data refresh cycle is relatively high. Thus, it is descried to have cells with high data retention times.

One technique used to determine the data refresh rate for a memory array is to use an external (i.e., off-chip) tester. The tester measures the data retention time of each of the memory cells in the array. A minimum data retention time is thus determined by the "weakest" of all the memory cells (i.e., the cell with the shortest data retention time). If this data retention time is below a specified value, these "weak" cells cannot be used and may, be replaced with redundancy cells, if they are available. Otherwise, the chip must be discarded thereby reducing yield and increasing product cost.

Figure 1A:
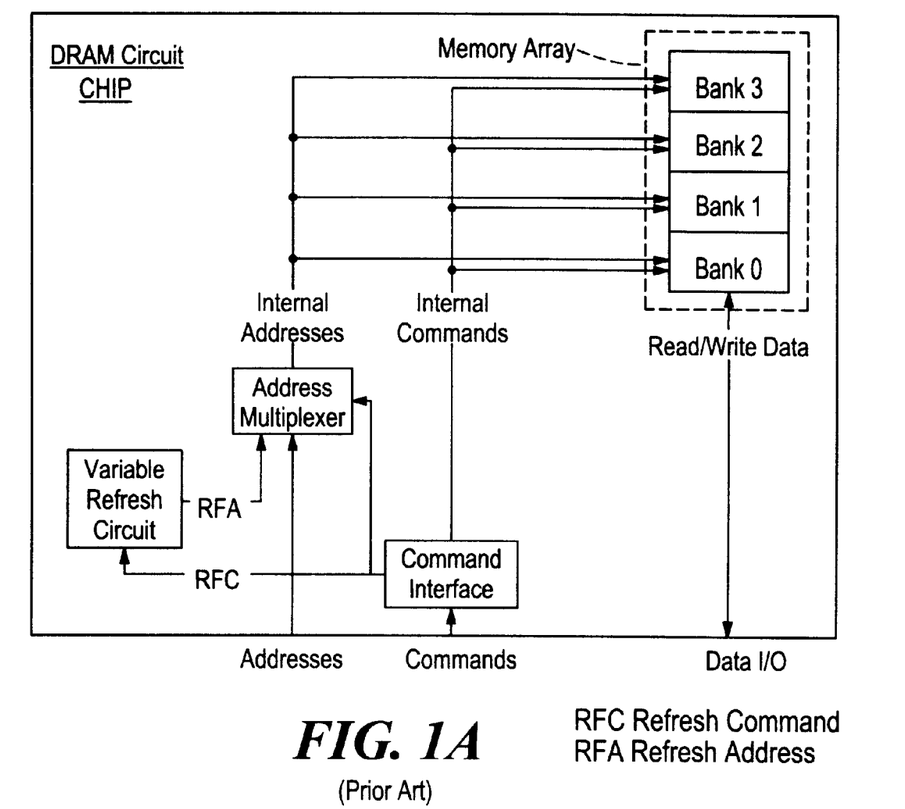
FIG. 1A is a schematic block diagram of a DRAM having refresh circuitry according to the PRIOR ART.
Figure 1B:
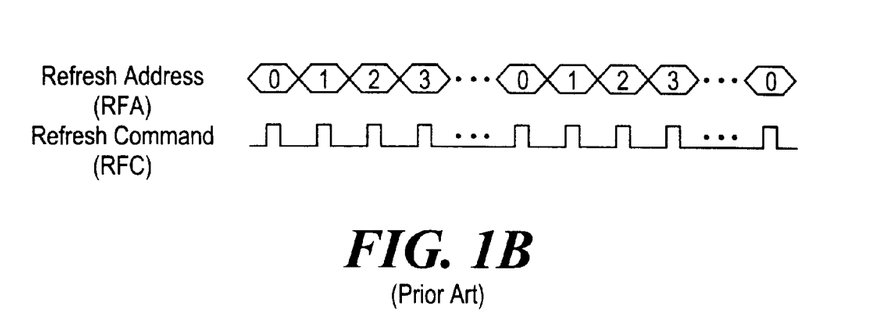
FIG. 1B is a timing diagram for a DRAM having refresh circuitry according to the PRIOR ART.

One typical DRAM is shown in FIG. 1. Thus, in this example, the memory array includes four banks of memory cells refreshed by a refresh circuit. The refresh circuit includes a counter for supplying row addresses to the memory cells in response to refresh commands supplied externally of the chip. Thus, the DRAM includes an internal, i.e., on-chip, refresh counter which supplies the row address of the word line that is to be refreshed with the next external refresh command. The counter either starts from an arbitrary row address or is preset to some initial value. After the counter reaches its maximum value, it wraps around and restarts with its minimum value. The counter value is incremented wit=h each external refresh command.

Another refresh system is described in U.S. Pat. No. 5,857,143 entitled "Dynamic Memory Device With Refresh Circuit and Refresh Method", inventor Ben-Zvi, issued Feb. 23, 1999. Here, the memory array can be refreshed partially to reduce energy consumption. Still another refresh circuit is described in U.S. Pat. No. 5,331,601 entitled "DRAM Variable Row Select" inventor Parris, issued Jul. 19, 1994. Here a memory device alters the input refresh addresses to fewer memory cells to save power, or to address more memory cells to decrease refresh time.

SUMMARY

In accordance with the present invention, a refresh circuit is provided for refreshing data stored in an array of dynamic memory cells is provided. The circuit includes an integrated circuit chip. The chip has the array of memory cells formed thereon. The circuit also includes a refresh rate analysis circuit for determining data retention times in each one of the memory cells and from such determination refresh address modification signals. Also provided is a refresh address generator formed on the chip and fed by refresh command signals generated externally of the chip and by the address modification signals. The refresh address generator supplies an internal refresh command signal along with refresh addresses to the array of memory cells. The cells have data stored therein in response to the internal refresh command signals, such refreshed cells being addressed by the refresh addresses.

With such an arrangement, power consumption and/or yield may be increased.

In one embodiment, the refresh rate analysis circuit is formed on the chip.

In accordance with one embodiment, the refresh rate analysis circuit determines cells in the array having data retention times less than a predetermined value. The refresh address generator generates the internal refresh commands at a first rate for the memory cells having retention times greater than such predetermined value and the internal refresh commands at a second lower rate for cells having retention times greater that such predetermined value.

In one embodiment, the refresh rate analysis circuit determines cells in the array having data retention times less than a predetermined value. The refresh address generator generates internal refresh commands and refresh addresses during a first cycle and a during a subsequent second cycle. During the first cycle the memory cells in the array are supplied the internal refresh commands and wherein during the second cycle only a fractional portion of the cells in such array are supplied the internal refresh commands.

With such embodiment, power is saved since during the second cycle cells with higher data retention times are not refreshed.

In one embodiment, the refresh rate analysis circuit determines cells in the array having data retention times less than a predetermined value. The refresh address generator generates internal refresh commands during a first cycle and a during a subsequent second cycle. During the first cycle the memory cells in the array are supplied internal refresh commands and wherein during the second cycle the same one of the cells in such array is supplied a plurality of refresh commands.

With such embodiment, the first and second cycles are initiated in response to each externally generated refresh command. Yet, yield is improved because cells having data retention times less than the time external refresh commands are supplied are able to be retained and not discarded because they are refreshed more than once during the second refresh cycle.

In one embodiment, the refresh rate analysis circuit determines cells in the array having data retention times less than a predetermined value. The refresh address generator generates internal refresh commands during a first cycle and a during a subsequent second cycle. During each one of the first and second cycles the refresh address generators generates a plurality of the internal refresh commands. During the first cycle the memory cells in the array are each supplied a corresponding one of the plurality of internal refresh commands. During the second cycle one of the cells in such array is supplied a more than one of the plurality of the internal refresh commands and another one of the cells is inhibited from being supplied at least one of the plurality of the internal refresh commands.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 2:
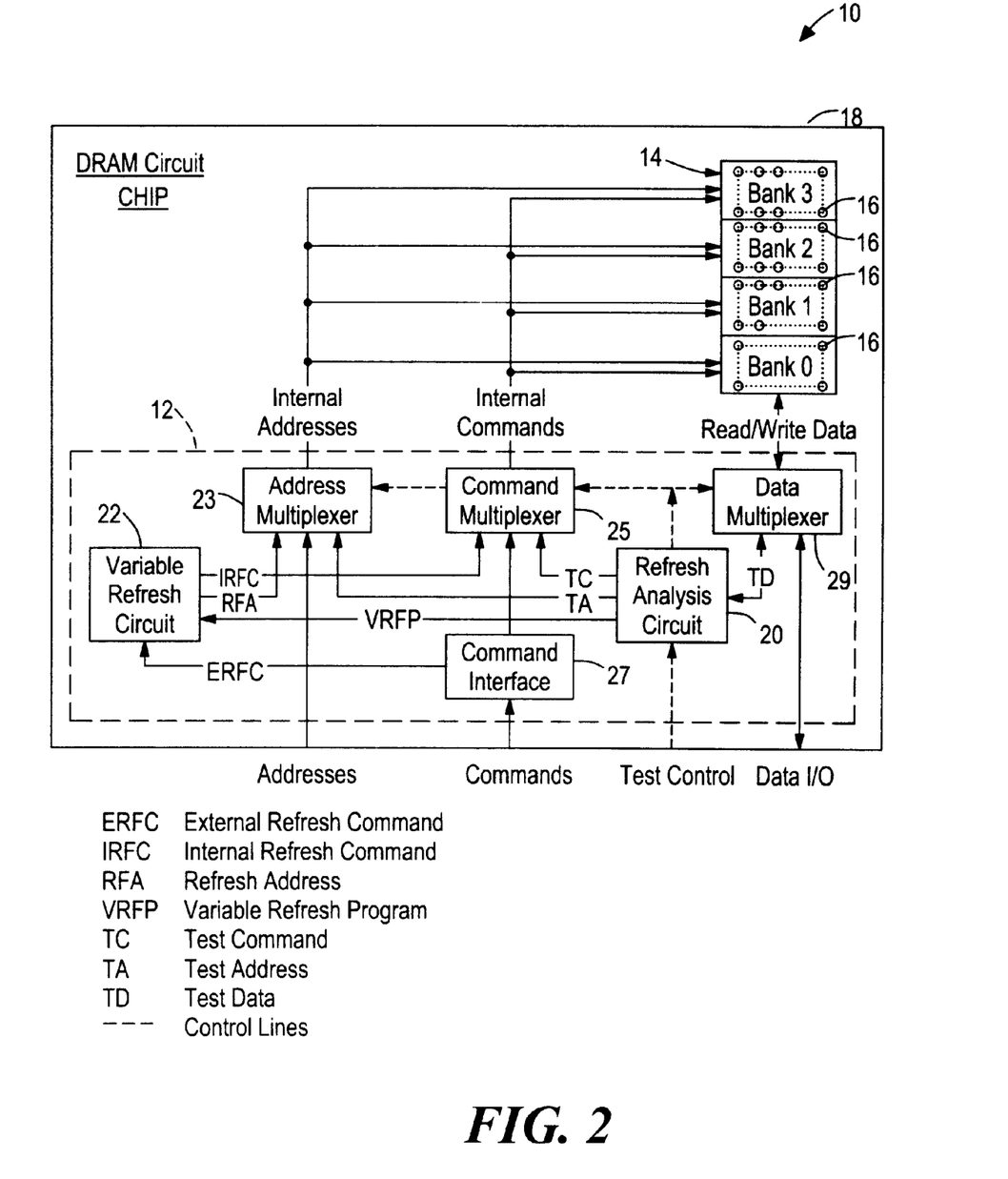
FIG. 2 is a schematic block diagram of, and timing diagram for, a DRAM having refresh circuitry according to the invention.

Referring now to FIG. 2, a simplified, schematic block diagram of, and timing diagram for, a dynamic memory, here a DRAM 10 having refresh circuitry 12 are shown. The refresh circuit 12 is provided for refreshing data stored in an array 14 of dynamic memory cells 16. The DRAM 10 is formed on an integrated circuit chip 18. The chip 16 has the array 14 of memory cells 16 formed thereon. Here, the array 14 is arranged in four banks of cells 16 (here, Bank 0, Bank 1, Bank 2 and Bank 3). The cells 16 are arranged in rows and columns. The columns are so-called bit lines and the rows are so-called word lines.

The refresh circuitry 12 also includes a refresh rate analysis circuit 20 for determining data retention times in each one of the memory cells and from such determination refresh address modification signals. Also provided is a refresh address generator 22 formed on the chip and fed by refresh command signals generated externally of the chip 18 and by the address modification signals produced by the refresh analysis circuit 20 in a manner to be described. The refresh address generator 22 supplies an internal refresh command along with refresh addresses to the array 14 of memory cells 16. The cells 16 have data stored therein refreshed in response to the internal refresh command, such cells being refreshed being addressed by the refresh address supplied by the variable refresh circuit 22. Here the refresh rate analysis circuit 20 is formed on the chip 18.

The refresh rate analysis circuit 20 determines cells 16 in the array 14 having data retention times less than a predetermined value. The process for making such determination will be described in more detail below in connection with FIG. 3. Suffice it to say here, however, that the refresh address generator 22 shown and to be described in more detail in connection with FIG. 4 generates the internal refresh commands for array 14 at a first rate for the memory cells 16 having retention times greater than such predetermined value and refresh addresses at a second lower rate for cells 16 having retention times greater that such predetermined value. With such circuit 22', power is saved since during the second cycle cells with higher data retention times are not refreshed. In the refresh address generator 22' shown and to be described in more detail in connection with FIG. 5, the refresh address generator 22' generates internal refresh commands for array 14 during a first cycle and a during a subsequent second cycle. During the first cycle the memory cells 16 in the array 14 are supplied the internal refresh commands and wherein during the second cycle the same one of the cells 16 in such array 14 is supplied a plurality of the internal refresh commands. With circuit 22' the first and second cycles are initiated in response to each externally generated refresh command. Yet, yield is improved because cells having data retention times less than the time external refresh commands are supplied are able to be retained and not discarded because they are refreshed more than once during the second refresh cycle.

More particularly, referring again to FIGS. 2 and 3, the refresh analysis circuit 20 determines the minimum charge retention time of the cells 16 within each one of the four array 14 banks or regions. It should be noted that each of the four regions can be independently refreshed. The minimum size of a region is one word line, the maximum size would be the entire array. The sizes of the regions do not have to be constant within a chip. The minimum retention time of these regions will follow a statistical distribution; i.e., they will differ from region to region. After repair of any defective cells with suitable redundant cells, the refresh analysis circuit 20 begins the process shown in FIG. 3.

Figure 3:
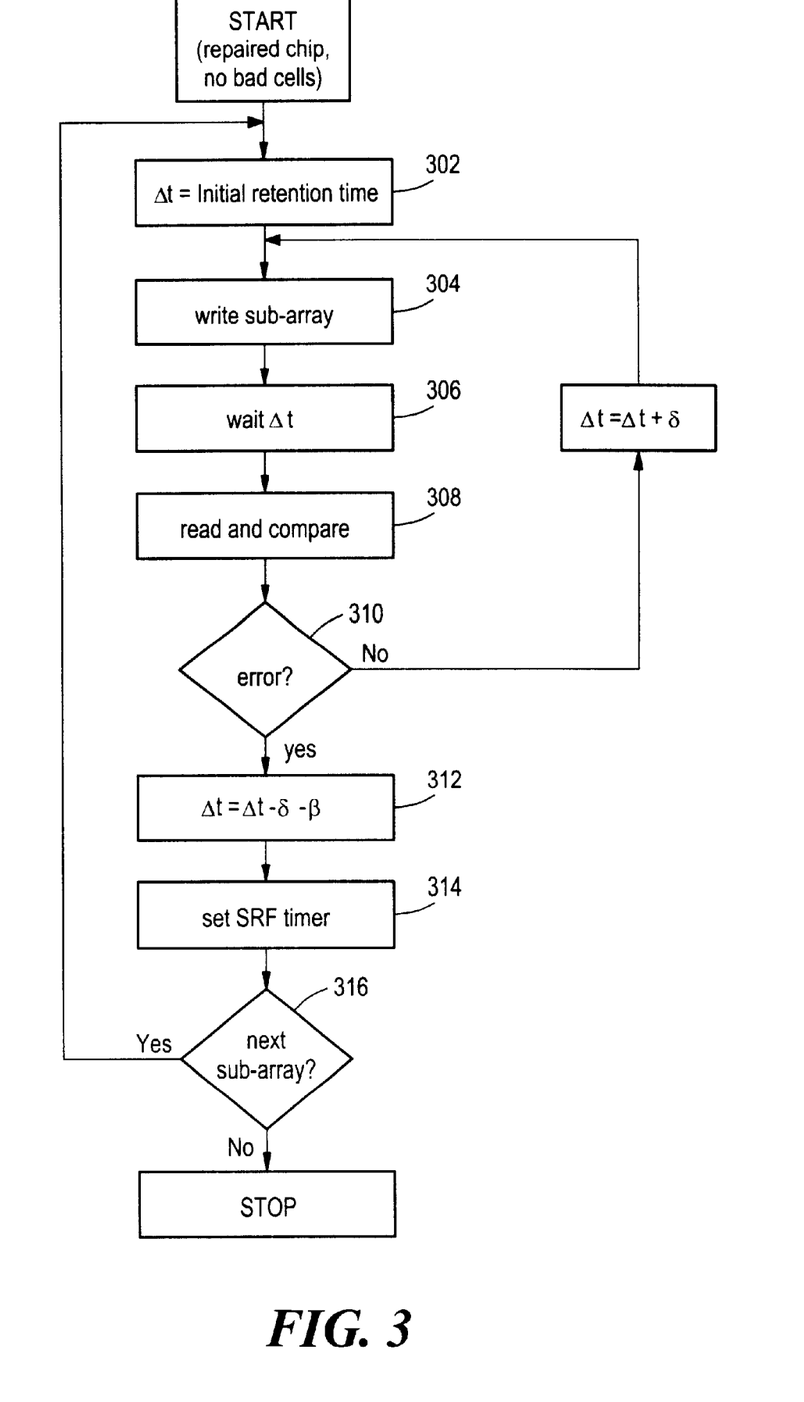
FIG. 3 is a flow diagram of a program stored in a refresh analysis circuit used in the refresh circuit of FIG. 2.

Thus, at Step 302, an initial retention time Δt is assumed. This initial, predetermined, retention time Δt may be obtained from testing a previous chip (Is that correct ??). In Step 304, the refresh analysis circuit 20 then writes a data pattern to the first region, via a DRAM Commands & Addresses BUS 30. In Step 306, the refresh analysis circuit 20 waits for the time period Δt. In Step 308, after such period Δt, the refresh analysis circuit 20 reads the data in the memory cells 16 of such region and compares the read data with the reference pattern. In Step 310, if no errors are found in the read data, the delay is increased by a certain a priori determined time increment δ (dependent on the desired resolution of the circuit 20) and the test is repeated (Steps 304, 306, 308 and 310) until a cell of the region under test fails in Step 310. This means that the predetermined retention time Δt exceeds the minimum retention time of the region.

The process then proceeds to Step 312 where the predetermined, retention time Δt is reduced by (δ-β) to guarantee a safety margin. This value is stored (Step 314) and the next region is tested (Step 314). The process continues until all regions, here all four regions have been tested. At the end of the test, there are stored in the circuit 20 here four minimum retention times, one for each one of the array regions. Thus, a table is generated relating memory region, which as noted above may be only one row address, and minimum retention time for such region. As will be described in more detail below, this table may be used to save power or improve yield. In the former case, the number of cells in the array being refreshed may be reduced during power saving cycles (i.e., no refresh for the cells in a region having cells with a relatively high retention time), which are interleaved with normal refresh cycles where cells in all the region are refreshed. This case is described in more detail in connection with the circuit 22 shown in FIG. 4. In the latter case the cells in the same region (i.e., the region having cells with relatively short retention times) may be refreshed more than once, albeit at the loss of a refresh in cells in another region (i.e., a region having cells with higher retention times). This case is described in more detail in connection with the circuit 22' shown in FIG. 5.

Thus, in summary to this point, the refresh circuit 20 (FIG. 2) supplies the row address of the word line in the array 16 that is to be refreshed next with external command. It has the ability to modify the incoming refresh command, e.g. suppress a refresh command, in response to signals supplied from the table in the refresh analysis circuit 20. The sequence of refresh addresses supplied by the refresh circuit 22 to the memory array regions is not preset for all DRAMs of the same kind but is here programmed individually for each DRAM being manufactured by the refresh analysis circuit 29. By modifying the sequence of the refresh addresses and by modifying the refresh command, the circuit 10 is able to reduce the power consumption caused by refresh and/or increase the production yield. The individual refresh program can be supplied externally, e.g. from a memory tester or calculated internally (i.e., on-chip) by the on chip refresh analysis circuit 20. This circuit 10 writes and read data to and from the memory array 14. Modifying the delay between write and read allows the circuit 22 to analyze the refresh requirements as outlined above in connection with FIG. 2.

Thus, the refresh rate analysis circuit 20 determines cells 16 in the array 14 having data retention times less than a predetermined value. The refresh address generator 22 generates internal refresh commands during a first cycle, here periodic "normal refresh cycles" and a during a subsequent second cycle, here "power saving cycles" interleaved with the "normal refresh cycles". During each one of the first and second cycles the refresh address generators generate a plurality of the internal refresh commands, shown in FIG. 2. During the first cycle (i.e., a "normal refresh cycle") the memory cells 14 in the array 16 (here the memory cells in each of the four regions) are each supplied a corresponding one of the plurality of the internal refresh commands. During the second cycle (i.e., a "power saving cycle") only one of the cells (here the cells in only one of the four regions) in such array is supplied a more than one of the plurality of the internal refresh commands and another one of the cells is inhibited (here the other three of the four regions) from being supplied at least one of the plurality of the internal refresh commands.

Figure 4:
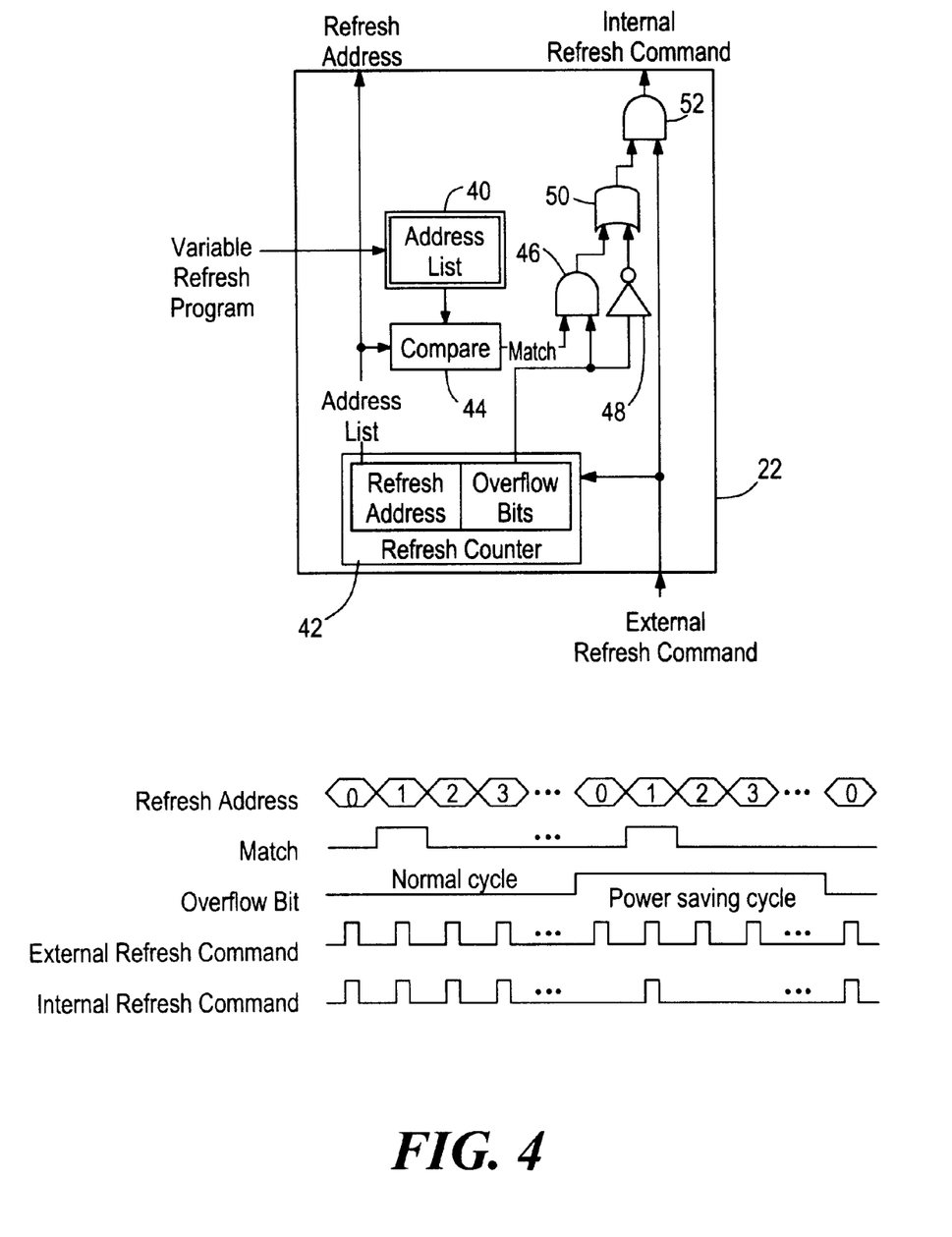
FIG. 4 is a block diagram of, as timing diagram for, a variable refresh rate circuit used in the refresh circuit of FIG. 2 according to one embodiment to reduce power.

In the example shown in FIG. 4, the analysis circuit 20 (FIG. 2) determined that only the cells in region 1 need be refreshed at twice the normal refresh rate. Thus, the addresses in region 1 are stored in an address list 40 of refresh circuit 22. As external refresh commands are supplied to the circuit 22 from off-chip, they are counted by counter 42. Counter 42 supplies incremented region addresses (i.e., addresses to region 0, followed by address to region 1, followed by addresses to region 3, followed by addresses to region 3) and is then reset to zero to repeat the external command counting process and also the logic state of an overflow bit of the counter 42 toggles between a logic 0 and a logic 1. Thus, when the overflow bit is a logic 0 the circuit 22 is in the "normal refresh cycle" and when the overflow bit is a logic 1 the circuit 22 is in the "power saving cycle". If the circuit 22 is in the "normal refresh cycle", the output of AND gate 46 is a logic 0 regardless of the output of the comparison circuit 44 and the output of inverter 48 is a logic 1. Thus, the OR gate 50 produces a logic 1 during the "normal refresh cycles" enabling the external commands to pass through AND gate 52 as internal refresh commands to all four regions of the array. During the next cycle of four external refresh commands, the overflow bit changes to a logic 1 and the circuit is in the "power saving cycle". The output of inverter 48 will be a logic 0 during this "power saving cycle". The output of AND gate 46 will also be a logic 0 until the counter increments to a region having an address matched to that stored in the address list 40. Thus, here in this example, the AND gate 46 produces a logic 1 during the "power saving cycle" only when the region address produced by the counter is region 1. When region 1 is addressed, the AND gate 40, OR gate 50 and AND gate 52 produce a logic 1 enabling an external command to pass as the internal refresh command to the array to enable refreshing of the cells in region 1. Thus, during the "power saving cycle" in this example, only the cells in region 1 are refreshed.

Thus, in summary, the refresh counter 42 supplies the refresh addresses with each external refresh command. After the maximum refresh address is reached, the counter 42 overflows into one or more overflow bits, here in this example, one bit. In other words, the bit length of the counter is extended by one or more bits. The value of the overflow bits control if the refresh command is passed directly to the memory array or if it is filtered by a chip specific program. For example, a list of "weak" refresh addresses is stored in the address list 40. Those addresses require the maximum refresh command executions, since the corresponding memory cells have a high leakage (weak cells). The rest of the refresh addresses can be refreshed at a lower rate (i.e., during the "power saving cycles") than the rate of the external refresh commands.

In an overflow state, the variable refresh circuit would filter out all refresh commands unless the weak refresh address list indicates that the refresh address generated by the refresh counter needs to be refreshed at the maximum rate. As a result, less refresh commands are executed compared to the prior art, leading to a significant power saving. FIG. 4 shows an example, assuming a single overflow bit and refresh region 1 addresses being weak addresses.

Figure 5:
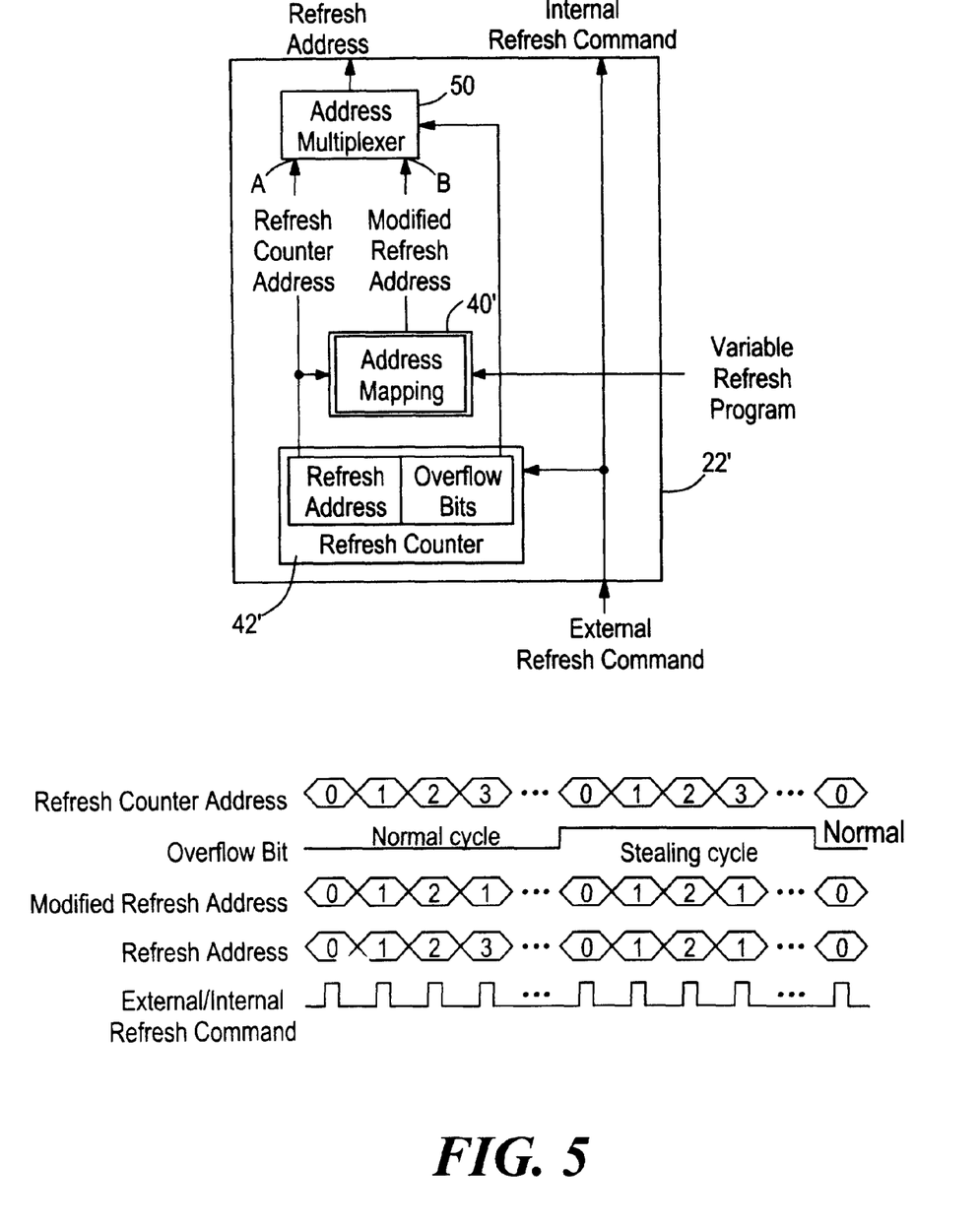
FIG. 5 is a block diagram of, as timing diagram for, a variable refresh rate circuit used in the refresh circuit of FIG. 2 according to another embodiment to improve yield.

In the example shown in FIG. 5, the analysis circuit 20' (FIG. 2) again determined that the cells in region 3 need be refreshed only every other refresh cycle while the cells in region 3 need to be refreshed at twice the refresh rate. Thus, the cells in the addresses in region 3 are mapped to and stored in address map 40' of refresh circuit 22'. That is, whenever the addresses for the cells in region 3 are produced by the counter 42' they are converted, or mapped, to addresses for the cells in region 1 while the other addresses remain unchanged, in this example. Thus, in this example, as the counter 42'; counts the external refresh commands, the counter 42' produces, sequentially, the addresses for the cells in region 0, then region 1, then region 2, then region 3 and again region 0 to repeat the process. However, in response top this sequence of address produced by counter 42', the addresses produced by the address map 40'; are region 0, then region 1 then region 2, then region 1 again, and then region 0 to repeat the process. Thus, during each refresh cycle, whether a "normal refresh cycle" or a "stealing refresh cycle", the address for the cells in region 1 are repeated while the addresses for the cells in region 3 are inhibited (i.e., stolen from region 3) and replaced by the addresses in region 1.

In operation, as external refresh commands are supplied to the circuit 22' from off-chip, they are counted by counter 42'. Counter 42' supplies incremented region addresses (i.e., addresses to region 0, followed by address to region 1, followed by addresses to region 3, followed by addresses to region 3) and is then reset to zero to repeat the external command counting process and also the logic state of an overflow bit of the counter 42' toggles between a logic 0 and a logic 1. Thus, when the overflow bit is a logic 0 the circuit 22' is in the "normal refresh cycle" and when the overflow bit is a logic 1 the circuit 22' is in the "stealing cycle". The circuit 22' includes a multiplexer 50 fed at input A thereof by the refresh address provided by the counter 42, and at input B thereof modified refresh addresses provided by the address map 40'. If the circuit 22' is in the "normal refresh cycle", the logic 0 overflow bit is fed to the multiplexer 50. In response to such logic 0 bit, (i.e., during the "normal refresh cycle") multiplexer 50 couples the refresh addresses sequentially through the multiplexer 50 to the array. Thus, during the "normal refresh cycles"0 the cells in the four regions are sequentially refreshed.

In summary, with regard to the circuit shown in FIG. 5, the chip specific program (FIG. 3) indicates if a refresh address supplied by the refresh counter should be replaced by a different refresh address. A "weak" refresh address "steals" refresh commands from a "strong" refresh address. Similar to FIG. 4, the stealing is not in effect for every cycle to guarantee that the strong addresses are refreshed too. The ratio of normal refresh operation cycles versus stealing cycles is again controlled by the overflow bit or bits of the refresh counter 42'. FIG. 5 shows an example with a single overflow bit, resulting in 50% normal cycles and 50% stealing cycles. During the stealing cycle, the weak addresses for region 1 steals a refresh command from the strong address for region 3. As a result, addresses for region 1 get refreshing which is 50% higher than in the prior art and addresses in region 3 get 50% less. This enables sale of a memory device with weak addresses without violating the external refresh requirements (i.e., resulting in yield improvement and lower cost—one would have to discard this chip as defective otherwise).

In FIG. 4 as well as in FIG. 5, the stored refresh addresses can cover the full bit width of a refresh address. However, also a subset (i.e., one of a plurality of regions thereof) is possible. On one hand, this reduces the granularity at which "weak" addresses can be specified, but on the other hand it beneficially reduces the storage requirements A number of embodiments of the invention have been described. Nevertheless, it will be understood that various modifications may be made without departing from the spirit and scope of the invention. Accordingly, other embodiments are within the scope of the following claims.

What is claimed is:

1. A refresh circuit for refreshing data stored in an array of dynamic memory cells, comprising:

an integrated circuit chip, such chip having formed thereon the array of memory cells;

a refresh rate analysis circuit for determining the data retention time in each one of the memory cells and from such determination refresh address modification signals; and a refresh address generator formed on the chip and fed by refresh command signals generated externally of the chip and by the address modification signals, such refresh address generator supplying an internal refresh commands along with refresh addresses to the array of memory cells, such cells having data stored therein refreshed in response to internal refresh commands, such cells refreshed cells being addressed by the refresh addresses.

2. The refresh circuit recited in claim 1 wherein the refresh rate analysis circuit is formed on the chip.

3. The refresh circuit recited in claim 1 wherein the refresh rate analysis circuit determines cells in the array having data retention times less than a predetermined value and wherein the refresh address generator generates the internal refresh commands at a first rate for the memory cells having retention times greater than such predetermined value and the internal refresh commands at a second lower rate for cells having retention times greater that such predetermined value.

4. The refresh circuit recited in claim 1 wherein the refresh rate analysis circuit determines cells in the array having data retention times less than a predetermined value and wherein the refresh address generator generates the internal refresh commands during a first cycle and a during a subsequent second cycle and wherein during the first cycle the memory cells in the array are supplied internal refresh commands and wherein during the second cycle only a fractional portion of the cells in such array are supplied internal refresh commands.

5. The refresh circuit recited in claim 1 wherein the refresh rate analysis circuit determines cells in the array having data retention times less than a predetermined value and wherein the refresh address generator generates the internal refresh commands during a first cycle and a during a subsequent second cycle and wherein during the first cycle the memory cells in the array are supplied internal refresh commands and wherein during the second cycle the same one of the cells in such array is supplied a plurality of the internal refresh commands.

6. The refresh circuit recited in claim 1 wherein the refresh rate analysis circuit determines cells in the array having data retention times less than a predetermined value;

(a) wherein the refresh address generator generates the internal refresh commands during a first cycle and a during a subsequent second cycle;

(b) wherein during each one of the first and second cycles the refresh address generators generates a plurality of the internal refresh commands;

(c) wherein during the first cycle the memory cells in the array are each supplied a corresponding one of the plurality of the internal refresh commands; and (d) wherein during the second cycle one of the cells in such array is supplied a more than one of the plurality of the internal refresh commands and another one of the cells is inhibited from being supplied at least one of the plurality of the internal refresh commands.

* * * * *

UNITED STATES PATENT AND TRADEMARK OFFICE
CERTIFICATE OF CORRECTION

PATENT NO. : 6,603,694 B1
DATED : August 5, 2003
INVENTOR(S) : Frankowsky et al.

It is certified that error appears in the above-identified patent and that said Letters Patent is hereby corrected as shown below:

Column 2,
Line 32, delete "during a first cycle and a during" and replace with -- during a first cycle and during --.

Column 5,
Line 29, delete "and a during" and replace with -- and during --.
Line 52, delete "followed by address to" and replace with -- followed by addresses to --.
Line 53, delete "by addresses to region 3" and replace with -- by addresses to region 2 --.

Column 8,
Line 6, delete "such cells refreshed cells" and replace with -- such refreshed cells --.

Signed and Sealed this

Ninth Day of March, 2004

JON W. DUDAS
*Acting Director of the United States Patent and Trademark Office*